(12) United States Patent
Lindblad et al.

(10) Patent No.: US 8,779,694 B1
(45) Date of Patent: Jul. 15, 2014

(54) LEDS ON FLEXIBLE SUBSTRATE ARRANGEMENT

(75) Inventors: Scott Lindblad, Burnsville, MN (US); David Neuman, Randolph, MN (US)

(73) Assignee: Automated Assembly Corporation, Lakeville, MN (US)

( * ) Notice: Subject to any disclaimer, the term of this patent is extended or adjusted under 35 U.S.C. 154(b) by 127 days.

(21) Appl. No.: 13/314,846

(22) Filed: Dec. 8, 2011

(51) Int. Cl.
*H05B 37/00* (2006.01)

(52) U.S. Cl.
USPC ............... 315/312; 315/185 R; 362/249.05

(58) Field of Classification Search
CPC ........... H01L 2224/73265; H01L 2224/48227; H01L 33/486; H05K 2201/10106; H05K 1/182; H05K 2203/063; H05B 33/0815; H05B 33/0818; H05B 41/2828
See application file for complete search history.

(56) References Cited

U.S. PATENT DOCUMENTS

| | | | |
|---|---|---|---|
| 5,562,971 A * | 10/1996 | Tsuru et al. | 428/209 |
| 5,598,382 A | 1/1997 | Wilson et al. | |
| 5,621,274 A | 4/1997 | McGuigan | |
| 5,811,930 A | 9/1998 | Krafcik et al. | |
| 5,821,691 A | 10/1998 | Richie et al. | |
| 5,830,028 A | 11/1998 | Zovko et al. | |
| 5,936,264 A * | 8/1999 | Ishinaga | 257/99 |
| 6,371,637 B1 * | 4/2002 | Atchinson et al. | 362/555 |
| 6,624,569 B1 | 9/2003 | Pennaz et al. | |
| 6,664,645 B2 | 12/2003 | Kawai | |
| 7,659,620 B2 * | 2/2010 | Fernandez | 257/736 |
| 7,679,099 B2 * | 3/2010 | Pang | 257/99 |
| 7,709,851 B2 * | 5/2010 | Bader et al. | 257/98 |
| 7,973,327 B2 | 7/2011 | West | |
| 7,989,838 B2 | 8/2011 | Ku | |
| 8,002,436 B2 | 8/2011 | Wang et al. | |
| 8,013,525 B2 | 9/2011 | Cok et al. | |
| 8,029,163 B2 | 10/2011 | Chen et al. | |
| 8,033,684 B2 * | 10/2011 | Marshall et al. | 362/249.02 |
| 8,052,303 B2 * | 11/2011 | Lo et al. | 362/249.05 |
| 8,083,238 B2 * | 12/2011 | Borges | 280/11.203 |
| 8,322,882 B2 * | 12/2012 | Ward | 362/249.02 |
| 8,330,176 B2 * | 12/2012 | Thompson et al. | 257/98 |

FOREIGN PATENT DOCUMENTS

WO WO2011/110175 9/2011

OTHER PUBLICATIONS

Horatio Quinones, Brian Sawatzky and Alec Babiarz. "Silicone-Phosphor Encapsulation for High Power White LEDS." Pan Pacific Symposium (Jan. 2008).

* cited by examiner

*Primary Examiner* — Alexander H Taningco
*Assistant Examiner* — Nelson Correa
(74) *Attorney, Agent, or Firm* — Crawford Maunu PLLC

(57) ABSTRACT

An LED lighting arrangement on a flexible substrate. The flexible substrate has an adhesive on a first surface. Straps are attached to the first surface of the flexible substrate by the adhesive. Each strap has a first surface, a second surface, and first and second terminals exposed on the first surface. The attachment of each strap to the substrate is with the second surface of the strap adhered to the substrate. LEDs are attached to the straps and coupled to the terminals on the straps. An arrangement of one or more wires is attached to the first surface of the flexible substrate by the adhesive. The wires are connected to the first and second terminals on the first surfaces of the plurality of straps to provide power to the LEDs.

36 Claims, 5 Drawing Sheets

LEDS ON FLEXIBLE SUBSTRATE ARRANGEMENT

FIELD OF THE INVENTION

The embodiments of the present invention generally relate to LEDs on a flexible substrate.

BACKGROUND

LED-based lighting is becoming more popular due in part to the energy efficient qualities and durability of LEDs. In some applications, LEDs are mounted on a flexible substrate such as those made from polyamides or polyimides. Prior to mounting the LEDs, wiring patterns are formed on the substrate using a print-and-etch process. The wiring patterns are laid out to accommodate placement of LEDs on the substrate at desired locations.

Making an LED arrangement using a polyamide or polyimide substrate may be prohibitively expensive for some applications calling for a flexible substrate. The expense is attributable to the substrate material and the print-and-etch processes used in creating the wiring pattern. Expensive chemicals are required for print-and-etch processes, and hazardous waste is a byproduct.

A structure and method that address these and other related issues are therefore desirable.

SUMMARY

The various embodiments of the invention provide LED lighting arrangements. In one embodiment, a lighting arrangement includes a flexible substrate having an adhesive on a first surface. Each strap of a plurality of straps has a first surface, a second surface, and first and second terminals exposed on the first surface. The second surface of each strap is attached to the first surface of the flexible substrate by the adhesive. Each LED of a plurality of LEDs is attached to one of the straps and is electrically coupled to the first and second terminals on that strap. An arrangement of one or more wires is attached to the first surface of the flexible substrate by the adhesive and connected to the first and second terminals on the first surfaces of the plurality of straps. The wiring arrangement is configured to provide power to the LEDs via the terminals on the straps.

In another embodiment, a lighting arrangement includes a flexible substrate having an adhesive on a first surface. A first strap is attached to the first surface of the flexible substrate by the adhesive. The first strap has a first surface, a second surface, and a plurality of terminals exposed on the first surface. The first strap is attached to the substrate with the second surface. A microcontroller is attached to the first strap and is electrically coupled to the plurality of terminals. Each LED strap of a plurality of LED straps has a first surface, a second surface, and a plurality of terminals exposed on the first surface. The second surface of each LED strap is attached to the first surface of the flexible substrate by the adhesive. Each LED of a plurality of LEDs is attached to one of the LED straps and each LED is electrically coupled to the plurality of terminals on the one of the LED straps. A wiring arrangement includes a plurality of wires attached to the first surface of the flexible substrate by the adhesive. The wiring arrangement is connected to the plurality of terminals on the first surface of the first strap and is connected to the plurality of terminals on the first surfaces of the LED straps. The wiring arrangement provides, via the terminals on the first strap and LED straps, power to the microcontroller and to the plurality of LEDs and provides control of the LEDs by the microcontroller.

A method of making a lighting arrangement is provided in another embodiment. The method includes mounting each LED of a plurality of LEDs on one strap of a plurality of straps. The straps are attached to selected locations on a flexible substrate. Power wires are attached to the flexible substrate with an adhesive, and the power wires are positioned over the terminals on the straps. After attaching the straps to the substrate, the wires are electrically attached to the terminals on the straps.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Other aspects and advantages of the invention will become apparent upon review of the Detailed Description and upon reference to the drawings in which.

DETAILED DESCRIPTION

The embodiments of the invention provide an LED lighting arrangement that is configured on a flexible substrate. Multiple straps are attached to the substrate by a pressure-sensitive adhesive. One or more LEDs are attached to each of the straps, and each LED is electrically coupled to conductive terminals on the strap. The straps are attached to the flexible substrate such that the surface of the strap having the terminals faces away from the substrate. This permits wiring for power to be laid over the straps and connected to the terminals. This is advantageous over other approaches in which the wiring is attached to the substrate prior to attaching the straps with the LEDs. In the other approaches, complex manufacturing processes are required to align the terminals on the strap with the wiring on the substrate since the points at which the wires and terminals attach are hidden from view. By first attaching the straps to the substrates and having the terminals exposed, the terminals are visible and the wiring can be laid over and readily connected to the exposed terminals on the straps. In various embodiments, the wiring is attached to the flexible substrate with pressure-sensitive adhesive.

Figure 1:
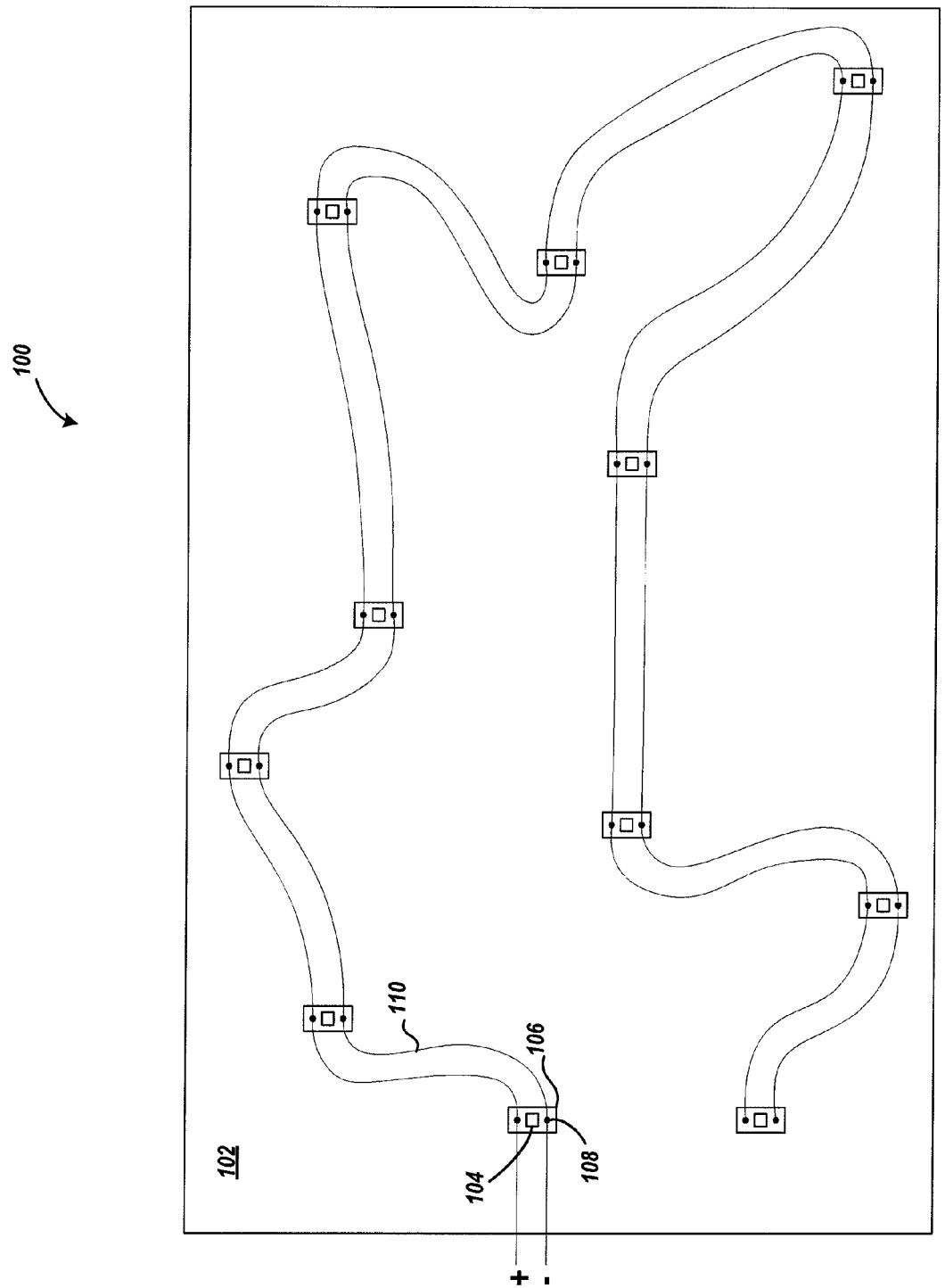
FIG. 1 is a top view of a lighting arrangement in accordance with one or more embodiments of the invention.

FIG. 1 is a top view of a lighting arrangement in accordance with one or more embodiments of the invention. The arrangement 100 includes a flexible substrate 102, on which multiple straps are attached. One or more LEDs are mounted on each of the straps. Element 104 illustrates an example one of the LEDs, and element 106 illustrates the strap on which the LED 104 is mounted.

Each strap has two terminals. An example one of the terminals is referenced as element 108. The LED is attached to bond pads (not shown) on the strap and is electrically coupled to the terminals by printed-and-etched traces (not shown) on the strap. The strap 106 is attached to the substrate 102, and the terminals 108 are exposed. The terminals 108 of the strap 106 are connected to power wire 110, which is laid over the exposed terminals and adhered to the substrate 102 with a pressure-sensitive adhesive. The example shows a single series connection of LEDs as an example. It will be appreciated however, that different applications may require or permit parallel wiring schemes. Different applications may also require multiple circuits of LEDs on a single substrate.

The embodiments of the invention are especially beneficial for use in graphics applications where complex layouts of LEDs and low-cost substrates are required. Such applications contemplate large sheets of flexible substrate material, for example for signs that are greater than 10 square feet. It will be recognized, however, that the embodiments may be suitable for nearly any size application. Though a simple layout of LEDs is illustrated, it will be appreciated that much more complex layouts could be made in accordance with embodiments of the invention.

The combination of the LED attached to the strap, the strap attached to the substrate with an adhesive, and copper wiring laid over the exposed terminal straps provides substantial benefits in reducing production costs. Because the LEDs and straps are not soldered to the substrate, a variety of inexpensive materials may be used for the substrate. The substrate is not limited to materials that can withstand high-temperature soldering. Because the straps with LEDs are attached to the substrate with the terminals on the straps exposed, the power wires can be laid over the straps, glued to the substrate, and then permanently connected to the terminals. Rather than using expensive print-and-etch techniques to make power lines for the LEDs, strands of wire can be glued to the substrate and electrically attached to the straps. The wire may be attached to the straps with a conductive adhesive or with low temperature soldering. The wire may be bare or insulated wire and made of any material suitable for the application. It will be appreciated that wire as used herein does not refer to printed or printed-and-etched patterns of conductive material. Rather, as used herein, wire refers to one or more strands of conductive material that have been made by drawing the conductive material through draw plates, for example. For some embodiments, only the straps need to be a material that is suitable for soldering and connecting to the LED, and the flexible substrate can be a material that is inexpensive. Instead of using polyamide or polyimide for the substrate, the substrate may be polyethylene terephthalate (PET), polyelectrolyte multilayers (PEMs), paper, or high-density polyethylene (e.g., TYVEK®), for example.

In one embodiment, the straps are made from polyamide or polyimide. Metal traces may be printed and etched to provide the bond pads for the LED and the terminals for connecting the power wires. In other embodiments, the straps may be made from various polyesters, polyethylene naphthalate (PEN), or vinyl. Different applications may require different strap configurations. In the simplest case, the strap is constructed with two terminals for powering a single LED. In other embodiments, the strap may be made with metal traces for powering multiple LEDs. Depending on application requirements, the strap may be made with one or more pairs of terminals for powering multiple LEDs.

The embodiments of the invention support reduced manufacturing costs. The process of connecting the power wires to the LEDs is simplified because the wires are laid over the exposed terminals on the straps. Instead of having to blindly align terminals of the strap with wiring that had been previously laid out on the substrate, the wires are laid over and connected to the visible terminals on the straps.

In one embodiment, the wire 110 is a fine gauge bare wire. For example, 44 gauge (AWG) copper wire has been found to be suitable for some applications. However, different gauges may be suitable for different applications. The wire is glued to the surface of the substrate with a polymer adhesive. In one embodiment, the adhesive is pressure sensitive, which keeps the wire in place as the wire is laid between straps on the substrate. For example, the adhesive may be an adhesive transfer tape such as VHB™ 9460PC transfer tape from 3M™ Company. It will be appreciated that other types of adhesives may be suitable for different applications.

The LEDs may be bare LEDs or packaged, depending on application requirements. Any of a number of commercially available LEDs may be suitable depending on the application.

Figure 2A:
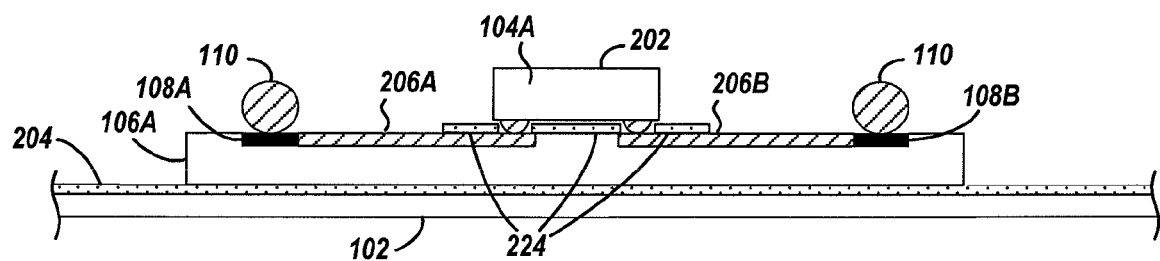
FIG. 2A is a cross-sectional view of an LED and strap disposed on a flexible substrate.

FIG. 2A is a cross-sectional view of an LED and strap disposed on a flexible substrate. The cross-sectional view shows an LED 104A that is attached to a strap 106A. The strap is attached to the substrate 102 with pressure-sensitive adhesive 204. For ease of illustration, the LED 104A is depicted as a simple block. Given that there are myriad bare LED and packaged LED structures, suitable orientations and connections of the LED to the metal traces will be recognized for the different embodiments even though the LED is depicted as a block.

The LED 104A is electrically connected to metal traces 206A and 206B by soldered connections, for example. The metal traces on the strap lead from the pads at which the LED is connected to terminals 108A and 108B. Being on the surface of the strap that faces away from the substrate, the terminals are thereby exposed for connection to power wiring. Wire 110 is electrically attached to terminals 108A and 108B. In one embodiment, the wire is soldered to the terminals, and in another embodiment the wire is attached to the terminals with a conductive adhesive.

For a packaged LED, a light-emitting surface 202 of LED 104A faces away from the substrate 102. For an unpackaged LED, a mirror layer 224 may be sputtered on strap 106A to reflect light, which is emitted from the LED toward the strap 106A, away from the strap. The sputtered mirror layer may be a highly reflective metallic material, for example.

Figure 2B:
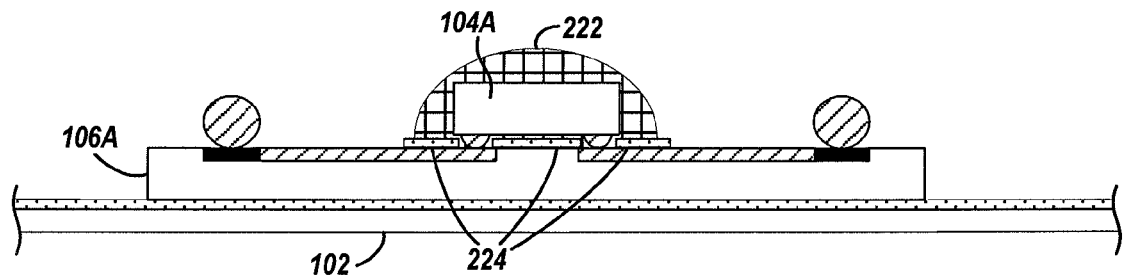
FIG. 2B is a cross-sectional view of an encapsulated LED and strap disposed on a flexible substrate.

FIG. 2B is a cross-sectional view of an LED 104A and strap 106A disposed on a flexible substrate 102. The LED is encapsulated in jettable phosphor-filled material 222. The phosphor in the material transforms the blue light emitted from the LED into white light. In one embodiment, the phosphor-filled material 222 is a phosphor-filled silicone.

The phosphor-filled material is jettable, which permits the material to be injected into the area between the LED 104A and the mirror coating 224 on the strap 106A. Thus, the encapsulation of the LED produces the desired shift in lighting as well as sealing the LED-to-strap connections from corrosive contaminants.

Figure 3A:
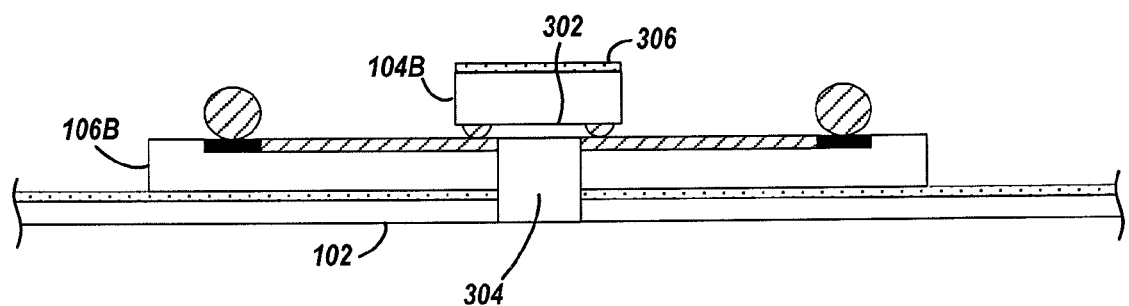
FIG. 3A is a cross-sectional view of an LED and strap disposed on a flexible substrate where a light-emitting portion of the LED faces the flexible substrate through an aperture in the strap.

FIG. 3A is a cross-sectional view of an LED 104B and strap 106B disposed on a flexible substrate 102 where the light-emitting portion 302 of the LED faces the flexible substrate 102 through an aperture 304 in the strap. In one embodiment, the aperture extends through both the strap and the substrate. In another embodiment (not shown), the aperture extends only through the strap, and the aperture does not extend through the substrate, whereby light from the LED is filtered through the substrate. For an unpackaged LED, a mirror layer 306 may be sputtered on a surface of the LED to reflect light, which is emitted from the LED away from the strap 106A, toward the aperture in the strap.

Figure 3B:
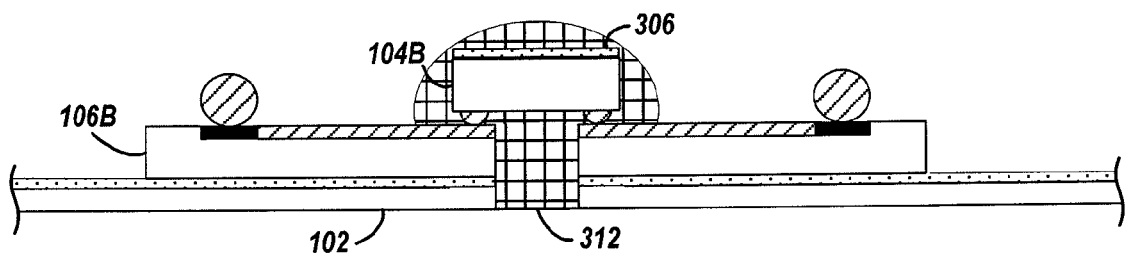
FIG. 3B is a cross-sectional view of an encapsulated LED and strap disposed on a flexible substrate.

FIG. 3B is a cross-sectional view of an LED 104B and strap 106B disposed on a flexible substrate 102. The LED is encapsulated in jettable phosphor-filled material 312, such as a phosphor-filled silicone. The phosphor-filled material fills the aperture 304 (from FIG. 3A) and also encapsulates the LED.

Figure 4:
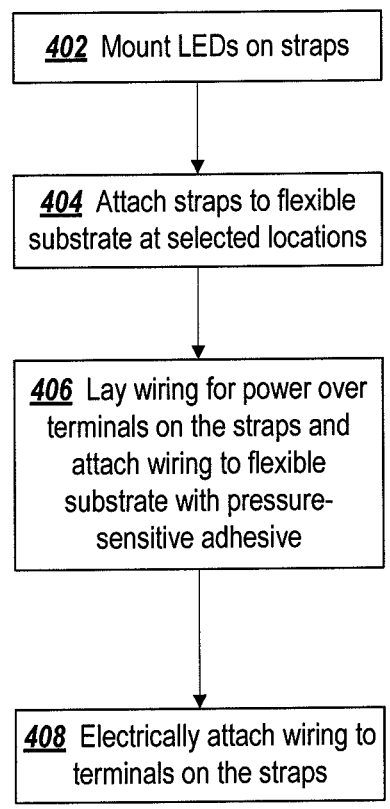
FIG. 4 is a flowchart of a process for making an LED lighting arrangement in accordance with one or more embodiments.

FIG. 4 is a flowchart of a process for making an LED lighting arrangement in accordance with one or more embodiments. At block 402, the LEDs are mounted on straps. In one embodiment, the LEDs are soldered to contact pads on the straps. The mounting process may further include encapsulating the LED by way of jetting a phosphor-filled silicone or epoxy beneath and over the LED.

The straps are attached to the flexible substrate at block 404. Pressure-sensitive adhesive may be used to easily position and mount the straps at the desired locations on the substrate.

At block 406, wires are laid over the terminals on the straps for providing power to the LEDs. In one embodiment, the wires are attached to the flexible substrate with a pressure-sensitive adhesive. The wires are electrically attached to the terminals on the straps at block 408. The wires may be soldered to the terminals or attached with a conductive adhesive according to application requirements.

Figure 5:
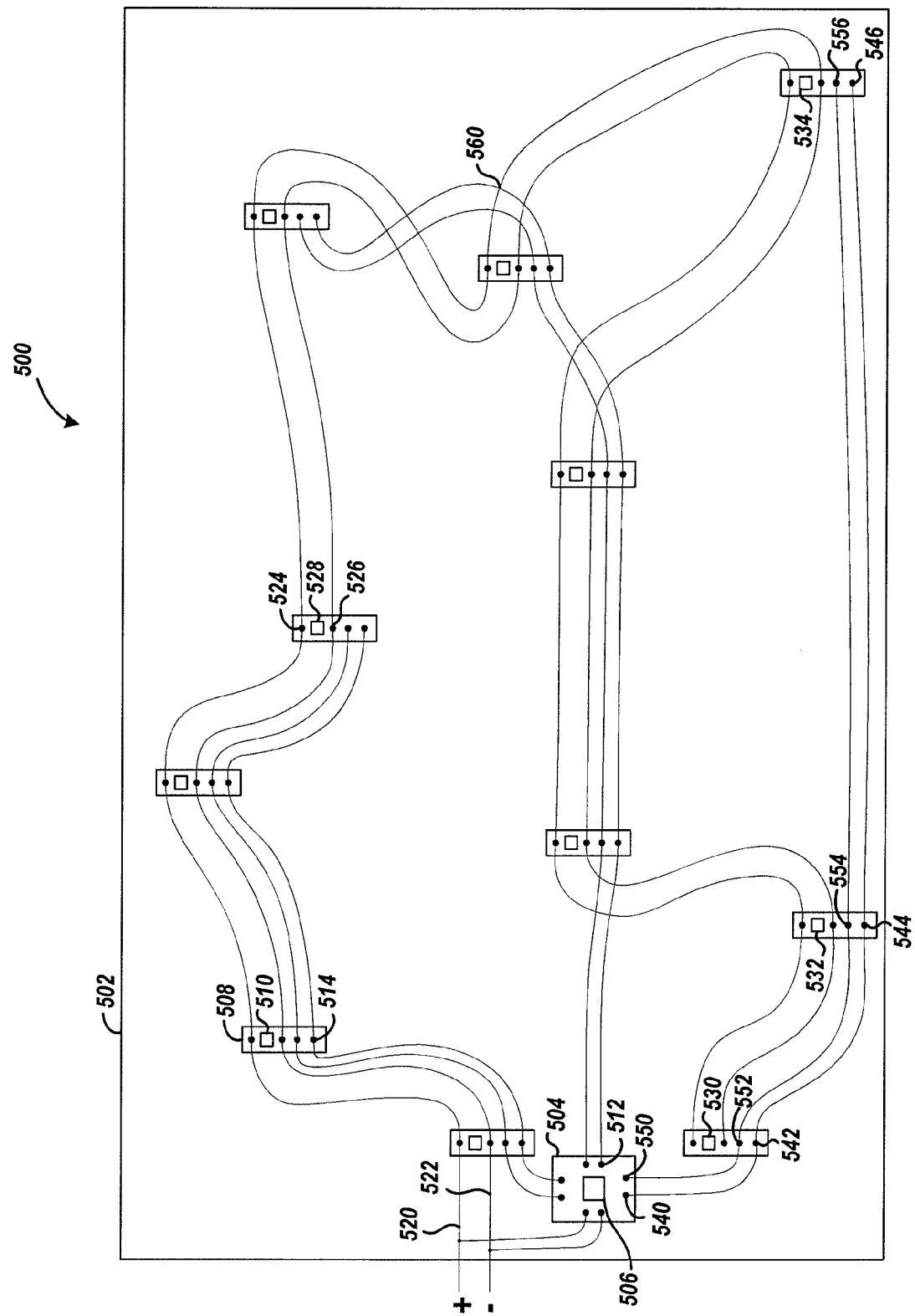
FIG. 5 is a top view of a lighting arrangement in accordance with one or more embodiments of the invention.

FIG. 5 is a top view of a lighting arrangement in accordance with one or more embodiments of the invention. The lighting arrangement 500 includes multiple strings of LEDs that are controlled by a microcontroller. Lighting arrangement 500 includes a flexible substrate 502, on which multiple straps are attached. Strap 504 has a microcontroller 506. The other straps, for example, strap 508, have one or more LEDs attached. Element 510 is an example one of the LEDs.

Each strap has multiple terminals. The microcontroller strap and LED straps are similar in structure to the strap 106 previously described, though the microcontroller strap and LED straps in the lighting arrangement 500 have additional terminals and bond pads. The example microcontroller strap 504 has 8 terminals, and each of the example LED straps has four terminals. Terminal 512 is an example terminal on microcontroller strap 504, and terminal 514 is an example terminal on LED strap 508. Power wires 520 and 522 are connected to the microcontroller via terminals on the strap 504 and connected to the LEDs' power terminals via the terminals on the LED straps. Terminals 524 and 526 are power terminals that are connected to LED 528, for example.

As in the lighting arrangement of FIG. 1, the terminals on both the microcontroller strap and LED straps in lighting arrangement 500 are on the sides of the straps facing away from the substrate 502. This permits power and control wiring to be laid over and connected to the terminals, thereby reducing manufacturing complexity. The straps and wiring of lighting arrangement 500 may be secured to the substrate 502 with a pressure-sensitive adhesive or other type of adhesive as described above for lighting arrangement 100. The wiring may be bare or insulated wire. For bare wire applications it will be appreciated that a non-conductive bridge (not shown) may be required where wires cross. For example, at intersection 560 an insulating tape may be adhered between the wires.

In the example lighting arrangement 500, the microcontroller 506 modulates the LEDs according to an internally stored program (not shown). The program may control dimming, adjusting of color-tone, and turning-on and turning-off power to the LEDs. The microcontroller 506 in the example lighting arrangement separately controls three strings of LEDs. For example, the LEDs on one string may be turned on while the LEDs on another string are turned off. Similarly, dimming may be separately controlled. An example one of the strings includes LEDs 530, 532, and 534. The communication from the microcontroller to the LEDs is serial, with two wires from the microcontroller connected to two control terminals on each strap in the string. For each string of LEDs, two terminals on the microcontroller LED strap 504 are wired in series to corresponding pairs of control terminals on the LED straps. For example, terminal 540 is coupled in series with terminals 542, 544, and 546, and terminal 550 is coupled in series with terminals 552, 554, and 556.

Any of a number of commercially available LEDs and microcontrollers may be suitable depending on the application. It will be appreciated that the microcontroller 506 and LEDs may have different numbers of terminals than those shown in the example arrangement. Thus, the straps may have more or fewer terminals than those shown, and there may be more or less wiring than that shown.

The present invention is thought to be applicable to a variety of LED-based lighting applications. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A lighting arrangement, comprising:
    a flexible substrate having adhesive on a first surface;
    a plurality of straps, each strap having a first surface, a second surface, and first and second terminals exposed on the first surface, wherein the second surface of each strap is attached to the first surface of the flexible substrate by the adhesive;
    a plurality of LEDs, each LED attached to one of the straps and electrically coupled to the first and second terminals;
    an arrangement of one or more wires attached to the first surface of the flexible substrate by the adhesive and directly connected to the first and second terminals, wherein connections between the one or more wires and the first and second terminals are on the first surfaces of the plurality of straps, and the arrangement of one or more wires is configured to provide power to the plurality of LEDs via the terminals on the straps.

2. The lighting arrangement of claim 1, further comprising a phosphor-filled material encapsulating each LED attached to each strap of the plurality of straps.

3. The lighting arrangement of claim 1, wherein each strap has an aperture, and a light emitting portion of each LED attached to the strap faces the flexible substrate at the aperture.

4. The lighting arrangement of claim 3, further comprising a phosphor-filled material encapsulating each LED attached to each strap of the plurality of straps, and the phosphor-filled material filling the aperture in each strap.

5. The lighting arrangement of claim 1, further comprising, on each strap of the plurality of straps, a mirror layer disposed between each LED attached to the strap.

6. The lighting arrangement of claim 1, further comprising:
    wherein each strap has an aperture, and a light emitting portion of each LED attached to the strap faces the flexible substrate at the aperture; and
    a mirror layer disposed on each LED over a portion of the LED.

7. The lighting arrangement of claim 1, wherein the plurality of LEDs includes, on one or more of the straps, two or more LEDs attached to each strap of the one or more straps and connected to the terminals on each strap of the one or more straps.

8. The lighting arrangement of claim 1, wherein the LEDs are unpackaged.

9. The lighting arrangement of claim 1, wherein the LEDs are packaged.

10. The lighting arrangement of claim 1, wherein the one or more wires are un-insulated.

11. The lighting arrangement of claim 1, wherein the one or more wires are insulated.

12. The lighting arrangement of claim 1, wherein the strap is made of one of polyamide, polyimide, a polyester, polyethylene naphthalate (PEN), or vinyl.

13. The lighting arrangement of claim 1, wherein the flexible substrate is made of one of a polyethylene terephthalate (PET), polyelectrolyte multilayers (PEMs), paper, high-density polyethylene, or vinyl.

14. The lighting arrangement of claim 1, wherein the one or more wires are soldered to the first and second terminals on each strap of the plurality of straps.

15. The lighting arrangement of claim 1, wherein the one or more wires are electrically attached to the first and second terminals on each strap of the plurality of straps with a conductive adhesive.

16. The lighting arrangement of claim 1, wherein the adhesive is a pressure-sensitive adhesive.

17. A lighting arrangement, comprising:
a flexible substrate having an adhesive on a first surface;
a first strap having a first surface, a second surface, and a plurality of terminals exposed on the first surface, wherein the second surface is attached to the first surface of the flexible substrate by the adhesive;
a microcontroller attached to the first strap and electrically coupled to the plurality of terminals;
a plurality of LED straps, each LED strap having a first surface, a second surface, and a plurality of terminals exposed on the first surface, wherein the second surface of each LED strap is attached to the first surface of the flexible substrate by the adhesive;
a plurality of LEDs, each LED attached to one of the LED straps and electrically coupled to the plurality of terminals on the one of the LED straps;
a wiring arrangement that includes a plurality of wires attached to the first surface of the flexible substrate by the adhesive, wherein the wiring arrangement is directly connected to the plurality of terminals on the first strap, and directly connected to the plurality of terminals on the LED straps, wherein connections between the wiring arrangement and the plurality of terminals on the first strap are on the first surface of the first strap, connections between the wiring arrangement and the plurality of terminals on the LED straps are on the first surfaces of the LED straps, and the wiring arrangement is configured to provide, via the terminals on the first strap and LED straps, power to the microcontroller and to the plurality of LEDs and control of the LEDs by the microcontroller.

18. The lighting arrangement of claim 17, further comprising a phosphor-filled material encapsulating each LED attached to each of the LED straps.

19. The lighting arrangement of claim 17, wherein each LED strap has an aperture, and a light emitting portion of each LED attached to the LED strap faces the flexible substrate at the aperture.

20. The lighting arrangement of claim 19, further comprising a phosphor-filled material encapsulating each LED attached to each LED strap, and the phosphor-filled material filling the aperture in each LED strap.

21. The lighting arrangement of claim 17, further comprising, on each LED strap, a mirror layer disposed between each LED attached to the LED strap.

22. The lighting arrangement of claim 17, further comprising:
wherein each LED strap has an aperture, and a light emitting portion of each LED attached to the LED strap faces the flexible substrate at the aperture; and
a mirror layer disposed on each LED over a portion of the LED.

23. The lighting arrangement of claim 17, wherein the plurality of LEDs includes, on one or more of the straps, two or more LEDs attached to each strap of the one or more straps and connected to the terminals on each strap of the one or more straps.

24. The lighting arrangement of claim 17, wherein the LEDs are unpackaged.

25. The lighting arrangement of claim 17, wherein the LEDs are packaged.

26. The lighting arrangement of claim 17, wherein the one or more wires are un-insulated.

27. The lighting arrangement of claim 17, wherein the one or more wires are insulated.

28. The lighting arrangement of claim 17, wherein the LED straps are made of one of polyamide, polyimide, a polyester, polyethylene naphthalate (PEN), or vinyl.

29. The lighting arrangement of claim 17, wherein the first strap is made of one of polyamide or polyimide.

30. The lighting arrangement of claim 17, wherein the flexible substrate is made of one of a polyethylene terephthalate (PET), polyelectrolyte multilayers (PEMs), paper, high-density polyethylene, or vinyl.

31. The lighting arrangement of claim 17, wherein the one or more wires are soldered to the terminals on the first strap and soldered to the terminals on the LED straps.

32. The lighting arrangement of claim 17, wherein the one or more wires are electrically attached to the first and second terminals on each strap of the plurality of straps with a conductive adhesive.

33. The lighting arrangement of claim 17, wherein the adhesive is a pressure-sensitive adhesive.

34. A method of making a lighting arrangement, comprising:
mounting each LED of a plurality of LEDs on one strap of a plurality of straps, wherein each strap has a first surface and a second surface, each LED being mounted on the first surface;
attaching the plurality of straps to selected locations on a flexible substrate, wherein the second surface of each strap faces the flexible substrate;
attaching power wires to the flexible substrate with an adhesive and positioning power wires over terminals on the straps, wherein the terminals are exposed on the first surfaces of the straps; and
after attaching the straps to the substrate, electrically connecting the wires to the terminals on the straps, wherein physical connections between the wires and the terminals are on the first surfaces of the straps.

35. The method of claim 34, wherein the attaching of the power wires to the flexible substrate includes attaching the power wires to the flexible substrate with a pressure-sensitive adhesive.

36. The method of claim 35, further comprising after mounting each LED on the one strap, jetting a phosphor-filled material between the LED and the one strap and encapsulating the LED with the phosphor-filled material.

* * * * *